(12) United States Patent
Ryding et al.

(10) Patent No.: US 6,689,221 B2
(45) Date of Patent: Feb. 10, 2004

(54) COOLING GAS DELIVERY SYSTEM FOR A ROTATABLE SEMICONDUCTOR SUBSTRATE SUPPORT ASSEMBLY

(75) Inventors: Geoffrey Ryding, Manchester, MA (US); Theodore H. Smick, Essex, MA (US)

(73) Assignee: Applied Materials, Inc., Santa Clara, CA (US)

(*) Notice: Subject to any disclaimer, the term of this patent is extended or adjusted under 35 U.S.C. 154(b) by 85 days.

(21) Appl. No.: 09/820,497

(22) Filed: Mar. 28, 2001

(65) Prior Publication Data

US 2002/0139307 A1 Oct. 3, 2002

Related U.S. Application Data

(60) Provisional application No. 60/251,080, filed on Dec. 4, 2000.

(51) Int. Cl.$^7$ ................................................ C23C 16/00
(52) U.S. Cl. .................. 118/730; 118/724; 156/345.53; 156/345.55
(58) Field of Search ..................... 118/730, 724, 118/728, 729; 156/345.51–345.53, 345.55

(56) References Cited

U.S. PATENT DOCUMENTS

| | | | | |
|---|---|---|---|---|
| 4,527,620 A | * | 7/1985 | Pederson et al. | 165/80 D |
| 4,559,718 A | * | 12/1985 | Tadokoro | 34/317 |
| 4,869,801 A | * | 9/1989 | Helms et al. | 204/298 |
| 4,949,783 A | * | 8/1990 | Lakios et al. | 165/80.1 |
| 5,061,356 A | * | 10/1991 | Tanaka et al. | 204/192.12 |
| 5,095,848 A | * | 3/1992 | Ikeno | 118/53 |
| 5,177,878 A | | 1/1993 | Visser | 34/92 |
| 5,228,501 A | * | 7/1993 | Tepman et al. | 165/80.1 |
| 5,343,938 A | * | 9/1994 | Schmidt | 165/80.2 |
| 5,356,476 A | * | 10/1994 | Foster et al. | 118/725 |
| 5,382,311 A | | 1/1995 | Ishikawa et al. | 156/345 |
| 5,421,892 A | * | 6/1995 | Miyagi | 118/724 |
| 5,427,620 A | * | 6/1995 | deBoer et al. | 118/725 |
| 5,522,131 A | | 6/1996 | Steger | 29/829 |
| 5,562,947 A | * | 10/1996 | White et al. | 427/255.5 |
| 5,898,179 A | | 4/1999 | Smick et al. | 250/492.21 |
| 5,976,312 A | * | 11/1999 | Shimizu et al. | 156/345 |
| 5,997,651 A | * | 12/1999 | Matsuse et al. | 118/725 |
| 6,045,315 A | * | 4/2000 | Azumano et al. | 414/217 |
| 6,062,798 A | * | 5/2000 | Muka | 414/416 |
| 6,179,921 B1 | * | 1/2001 | Ruffell et al. | 118/715 |
| 6,217,034 B1 | * | 4/2001 | Smedt et al. | 279/106 |
| 6,296,255 B1 | * | 10/2001 | Hashimoto | 277/558 |
| 6,446,296 B1 | * | 9/2002 | Middendorf et al. | 15/77 |

FOREIGN PATENT DOCUMENTS

| | | | | |
|---|---|---|---|---|
| EP | 1 046 881 A1 | 10/2000 | | G01B/11/27 |
| EP | 1 047 116 A2 | 10/2000 | | H02L/21/00 |

OTHER PUBLICATIONS

Search Report dated Nov. 7, 2002.
Ruffell "Backside Gas Delivery System for a Semiconductor Wafer Processing System" U.S. patent application Ser. No. 09/294,258, filed Apr. 19, 1999.
Dahimene et al. "Method and Apparatus for Supplying a Chucking Voltage to an Elecrostatic Chuck within a Seminconductor Wafer Processing System" U.S. patent application Ser. No. 09/054,575, filed Apr. 3, 1998.

* cited by examiner

*Primary Examiner*—Parviz Hassanzadel
*Assistant Examiner*—Karla Moore
(74) *Attorney, Agent, or Firm*—Moser, Patterson & Sheridan, LLP

(57) ABSTRACT

A semiconductor substrate support apparatus comprises a support chuck having at least one chuck manifold extending through the support chuck, and a rotatable shaft coupled to the support chuck. The shaft has at least one shaft conduit disposed therein and extends through the support chuck. A housing circumscribes the shaft and has a housing conduit adapted for connection to a gas source. A plurality of seals are disposed between the shaft and the housing and thereby define a radial passageway between the at least one shaft conduit and the housing conduit for providing a backside gas to a backside of a wafer disposed on the rotating support chuck.

32 Claims, 4 Drawing Sheets

COOLING GAS DELIVERY SYSTEM FOR A ROTATABLE SEMICONDUCTOR SUBSTRATE SUPPORT ASSEMBLY

CROSS REFERENCE TO RELATED APPLICATIONS

This application claims benefit of U.S. Provisional Application No. 60/251,080, filed Dec. 4, 2000.

BACKGROUND OF THE DISCLOSURE

1. Field of the Invention

The invention relates to a semiconductor wafer processing systems, and, in particular, to a backside gas delivery system for a semiconductor wafer processing system.

2. Description of the Background Art

Electrostatic chucks (ESC) are used in many single-wafer processing systems for retaining wafers during processing. In order to improve heat conduction between the wafer and the chuck, a backside gas supplied between the wafer and the support surface of the chuck is often used as a heat transfer medium. The design of a backside gas delivery system may have significant impact on the performance of the wafer processing system, especially in cases where stringent pressure control is required.

An ion implanter, such as the one described in commonly assigned U.S. Pat. No. 6,179,921, issued Jan. 30, 2001, entitled "Backside Gas Delivery System For A Semiconductor Wafer Processing System", and incorporated herein by reference, teaches an ion implanter that generates a beam of a selected specie of ions (e.g., dopant ions) and directs the beam towards a target wafer positioned on an electrostatic chuck of a wafer support assembly. Implantation is typically used for producing regions in the semiconductor wafer having an altered conductive state. In particular, the implanter implants ions of the dopant under the surface of the wafer. The ion beam generator is stationary, while the wafer support assembly is movably positioned facing the ion beam generator. Additionally, the chuck of the wafer support assembly is rotatable. During the ion implanting process the chuck rotates to permit the ion beam to strike predefined portions of the wafer. Such rotational movement of the chuck is limited by the internal and external chuck components attached thereto.

Furthermore, the Ruffell patent application teaches a backside gas delivery system having the gas shutoff valve disposed in the spindle. In particular, a backside gas supplied to the support assembly is provided by a flexible tubing from a gas source. The flexible tubing has a length that permits the chuck to rotate or move in any plane. However, the integrity of the flexible tubing becomes degraded during the course of repeated wafer processing and chuck rotation. For instance, as the chuck rotates, the flexible tubing wraps or coils around the support assembly, which subjects the flexible tubing structural stresses and fatigue. Eventually, gas leaks may occur, which reduce the backside gas delivered to the backside of the wafer. A reduction in backside gas will correspondingly reduce the amount of heat that may be transferred from the wafer, which may ultimately damage the wafer during processing. Furthermore, such gas leaks may enter the vacuum chamber and subsequently contaminate the wafer during processing.

Therefore, a need exists for a reliable backside gas delivery system that provides a heat transfer gas to the backside of the wafer, while permitting full rotational capabilities of the chuck during wafer processing.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

SUMMARY OF THE INVENTION

The disadvantages associated with the prior art are overcome by the present invention of an apparatus for a semiconductor wafer processing system comprising a gas delivery system for transferring heat from a backside of a wafer attached to a wafer support chuck (e.g., an electrostatic chuck). Specifically, the semiconductor substrate support apparatus comprises a support chuck having at least one chuck manifold extending through the support chuck and a rotatable shaft coupled to the support chuck. The shaft has at least one shaft conduit disposed therein and extends through the support chuck. A housing circumscribes the shaft, and the housing includes a housing conduit adapted for connection to a gas source. A plurality of seals are further disposed between the shaft and the housing and thereby define a radial passageway between the at least one shaft conduit and the housing conduit.

Thus, a backside gas can be delivered from the gas supply, through the housing conduit, the radial passageway, the at least one shaft conduit and to a backside of a wafer disposed on the rotating support chuck.

DETAILED DESCRIPTION

Figure 1:
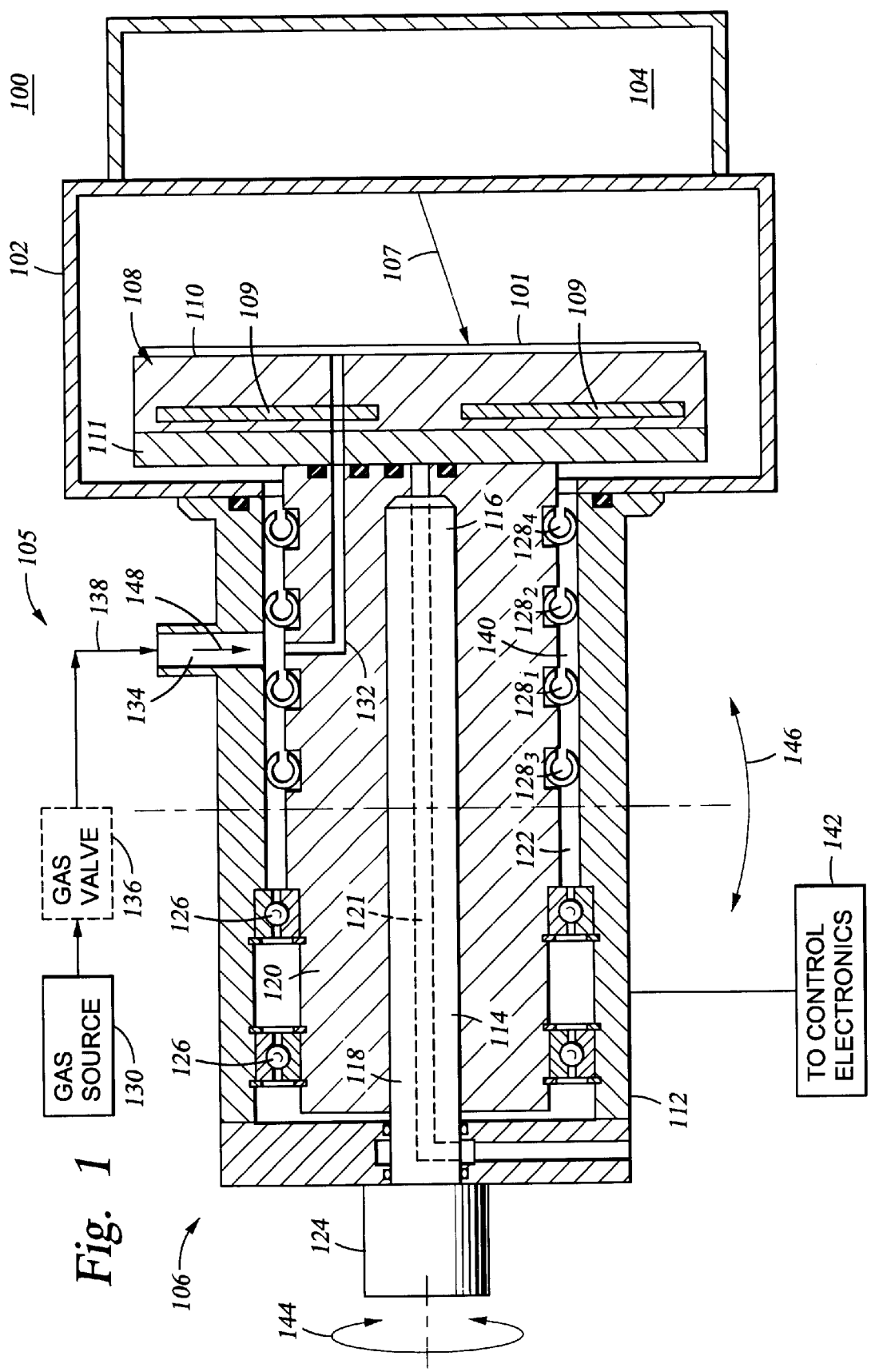
FIG. 1 depicts a schematic illustration of a backside gas delivery system in a semiconductor wafer processing system according to the present invention.

The present invention is an apparatus for a semiconductor wafer processing system having a gas delivery system capable of delivering a backside gas to a rotatable electrostatic chuck disposed within a chamber of the wafer processing system. FIG. 1 depicts a schematic illustration of a backside gas delivery system 105 in a semiconductor wafer processing system 100 according to the present invention. A backside gas delivery system 105 of the present invention is connected to a wafer support assembly 106, which is partially disposed in a semiconductor wafer processing chamber 102. For purposes of discussing the present invention, the semiconductor wafer-processing chamber 102 will be discussed as an ion implanter. However, a person skilled in the art for which this invention pertains will understand that the backside gas delivery system 105 of the present invention may also be utilized in a chemical vapor deposition (CVD) chamber, a physical vapor deposition (PVD) chamber, an etching chamber, or any other wafer processing system that requires a backside gas to transfer heat from the backside of a wafer 101 to a rotating wafer support assembly 106.

Specifically, the semiconductor wafer processing system 100 comprises the ion implanter chamber 102, an ion generator 104, the wafer support assembly 106 having a substrate support e.g., an electrostatic chuck (ESC) 108, and the backside gas delivery system 105. The substrate support 108 of the wafer support assembly 106 is disposed in the processing chamber 102 and the remainder of the wafer support assembly 106 is external to the chamber 102. A wafer 101 is chucked to the electrostatic chuck 108 and the air in the chamber 102 is evacuated via a pump (not shown) to a vacuum environment. The wafer 101 is positioned to face the ion generator 104 and the ion generator 104 generates an ion beam 107 for implanting ions into the wafer 101.

The wafer support assembly 106 comprises the electrostatic chuck 108 having a support surface 110, a spindle 114, a housing 112, a shaft 120, and the backside gas delivery system 105. Generally, the spindle 114 is fixedly inserted into the shaft 120 and coupled to the chuck 108. The housing 112 is cylindrical and circumscribes the shaft 120, which facilitates rotational movement of the shaft 120, spindle 114, and ESC 108 therein. The spindle 114 and shaft 120 used with a serial ion implanter is designed to be movable in several directions, that is, the spindle 114 and shaft 120 can translate in a direction orthogonal to the direction of an incident ion beam along path 146, as well as rotate and tilt as depicted by arrows 144 and 146 respectively. The combination of these motions allows a uniform exposure of a wafer to the ion beam. For a detailed understanding of the rotational and translational movements of the chuck 108, the reader is directed to the drawings and the description in U.S. Pat. No. 5,898,179, issued Apr. 27, 1999, by Smick et al., and incorporated herein by reference. That patent teaches translational and rotational movement of the wafer support 108 in a SWIFT™ ion implanter having a WHISPER SCAN™ processing station from Applied Materials, Inc. of Santa Clara, Calif.

The electrostatic chuck 108 is fabricated from a cylindrical puck of a ceramic material such as aluminum nitride, aluminum oxide, boron nitride, alumina doped with a titanium oxide, and the like, and has one or more chucking electrodes 109 disposed near the support surface 110 of the chuck 108. The one or more electrodes 109 are fabricated from a conductive material such as molybdenum, titanium, or the like. The one or more electrodes 109 may be in any configuration that will secure the wafer 101 to the chuck surface 110 and sustain the wafer 101 in a vertical position and from centrifugal forces generated by the rotation of the chuck 108 during processing. In particular, the wafer 101 is chucked to the wafer support assembly 106 by at least one chucking electrode 109 via Coulombic forces between the electrode 109 and the backside of the wafer 101. Alternately, the wafer 101 is chucked to the wafer support assembly 106 via the Johnsen-Rahbek effect.

For a detailed understanding of chucking a wafer 101 to a wafer support assembly 106, the reader should refer to the drawings and the detailed description in commonly assigned U.S. Pat. No. 6,198,616, issued Mar. 6, 2001, entitled "Method and Apparatus for Supplying a Chucking Voltage to an Electrostatic Chuck within a Semiconductor Wafer Processing System", and incorporated herein by reference. That patent teaches chucking a wafer 101 to a wafer support surface 110 using the Johnsen-Rahbek effect with a bipolar chucking electrode configuration. The chucking force produced by the Johnsen-Rahbek effect is between the backside of the wafer 101 and the surface 110 of the chuck 108. The Coulombic forces generated by the opposing charges therebetween are very strong and permit the chuck to be positioned vertically and mechanically moved from a horizontal position to the vertical position without the wafer 101 moving across the surface 110 of the chuck.

Furthermore, a person skilled in the art for which this invention pertains will understand that the use of an electrostatic chuck 108 in the present embodiment is for illustrative purpose only. In particular, the invention may be practiced with different wafer support chucks used in various ion implanters, including for example, a wafer platen equipped with a clamp ring.

Figure 4:
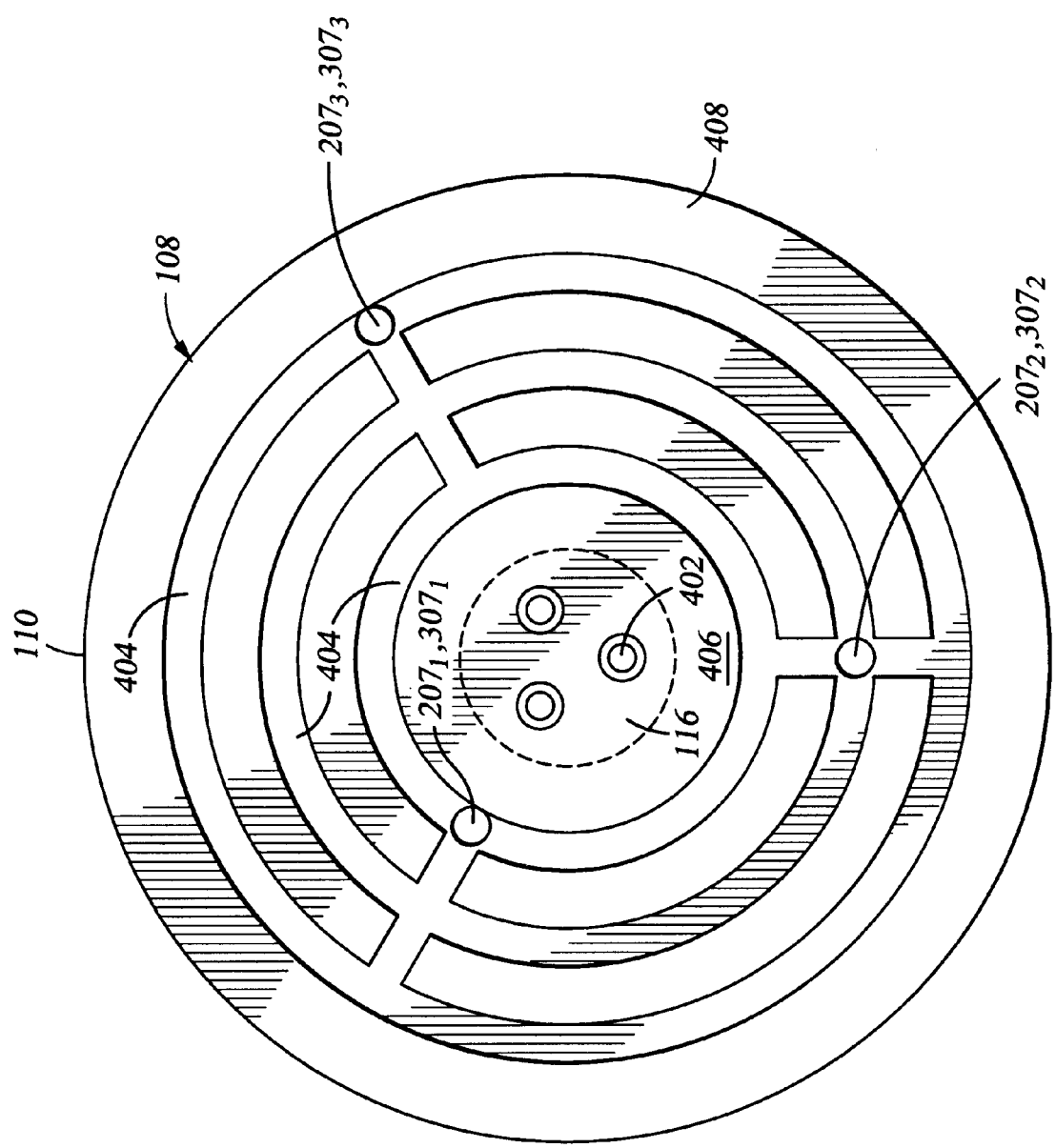
FIG. 4 depicts a top view of the substrate support assembly of the semiconductor wafer processing system of FIGS. 2 and 3.

The electrostatic chuck 108 is coupled to a first end 116 of the spindle 114. FIG. 4 depicts a top view of the substrate support assembly of the semiconductor wafer processing system of FIG. 2. Specifically, FIG. 4 depicts the support surface 110 of the chuck 108 without the wafer 101 disposed thereon. Referring to FIGS. 1 and 4, the first end 116 of the spindle 114 is fixedly coupled to the center of the electrostatic chuck 108 via a plurality of fasteners, illustratively, a plurality of bolts 402 extending through the electrostatic chuck 108 and threaded into a plurality of coinciding threaded bores (not shown) in the spindle 114.

Alternately, the spindle 114 is coupled to a cooling plate 111 disposed below the electrostatic chuck 108, and the chuck 108 is coupled to the cooling plate 111. The cooling plate 111 provides a cooling fluid, such as water, through channels (not shown) disposed therein. A cooling fluid source (not shown) external to the chamber 102 provides the cooling fluid via a pair of fluid lines 121 (shown in phantom) extending through the spindle 114 to form a closed cooling fluid system. Together, the backside gas system 105 and closed cooling fluid system provide temperature control for the electrostatic chuck 108.

A second end 118 of the spindle 114 is coupled to a motor 124. The motor 124 is powered by an AC power source (not shown), which is capable of rotating the spindle 114 and chuck 108 120 revolutions per minute (rpm). However, one skilled in the art will recognize that a DC power source may also be utilized. The motor 124 is capable of rotating the chuck 108 in either a clockwise or counter-clockwise direction as depicted along path 144.

The spindle 114 is fabricated from a material having a high tensile strength such as aluminum, stainless steel, and the like. The spindle 114 is coaxial with and housed in the shaft 120, which extends in length from the first end 116 to the second end 118 of the spindle 114 and terminates proximate the motor 124. The shaft 120 is fabricated from a material selected from the group aluminum, stainless steel, and the like, and preferably from hardend tool steel. The shaft 120 rigidly circumscribes the spindle 114 such that the motor 124 rotates the spindle 114, the shaft 120, and the chuck 108 together as a single wafer-chucking component. Specifically, the spindle 114 is press fit into the shaft 120 and may include a sleeve material (not shown) therebetween, such as ULTEM® or the like, for providing an electrically conductive and thermally insulative sleeve. Alternately, the shaft 120 may be bolted or welded to the spindle 114.

Circumscribing the shaft 120 and the spindle 114 is the cylindrical housing 112. The housing 112 is fabricated from a material selected from the group aluminum, stainless steel, and the like. Furthermore, the housing 112 and shaft 120 define a support assembly channel 122 therebetween, which extends the length of the shaft 120. Supporting the shaft 120 within the support assembly channel 122 is a pair of bearings 126. The bearings 126 are fabricated from a material such as hardend tool steel. The pair of bearings 126 are disposed in the housing 112 proximate the motor 124. Furthermore, each of the pair of bearings 126 communicates with the shaft 120 by extending into the channel 122 and circumscribing the shaft 120. In this manner, the bearings 126 support the shaft 120, as well as facilitate rotation of the combined shaft 120 and spindle 114 within the housing 112.

Thus, the spindle 114 and shaft 120 facilitate housing various conduits, lines, and signal paths for the various components of the chuck 108, as well as rotating the chuck 108.

Controlling the support assembly 106 are control electronics 142, which include a electrical components such as controllers, power supplies, support circuits, and the like (not shown). The various components requiring electrical connections are coupled to the control electronics 142 via a commutator (not shown) or any other such device that facilitates applying continuous power and signals to components in a rotating device. The control electronics 142 are utilized to control the chucking of the wafer, provide temperature sensing and control, pressure regulation, speed of the motor 124, and the like.

The backside gas delivery system 105 facilitates heat transfer from the backside of the wafer 101. The backside gas delivery system 105 comprises a gas source 130, a gas valve 136 (drawn in phantom), a housing conduit 134, and at least one shaft conduit 132. The gas source 130 is external to the chamber 102 and contains a heat transfer gas such as helium. The gas source 130 is coupled to the housing conduit 134 via a gas conduit 138 such as flexible tubing. The housing conduit 134 extends through the housing 112 to the support assembly channel 122. At least one shaft conduit 132 is disposed in the shaft 120 and extends through the electrostatic chuck 108 to the backside of the wafer 101.

Figure 2:
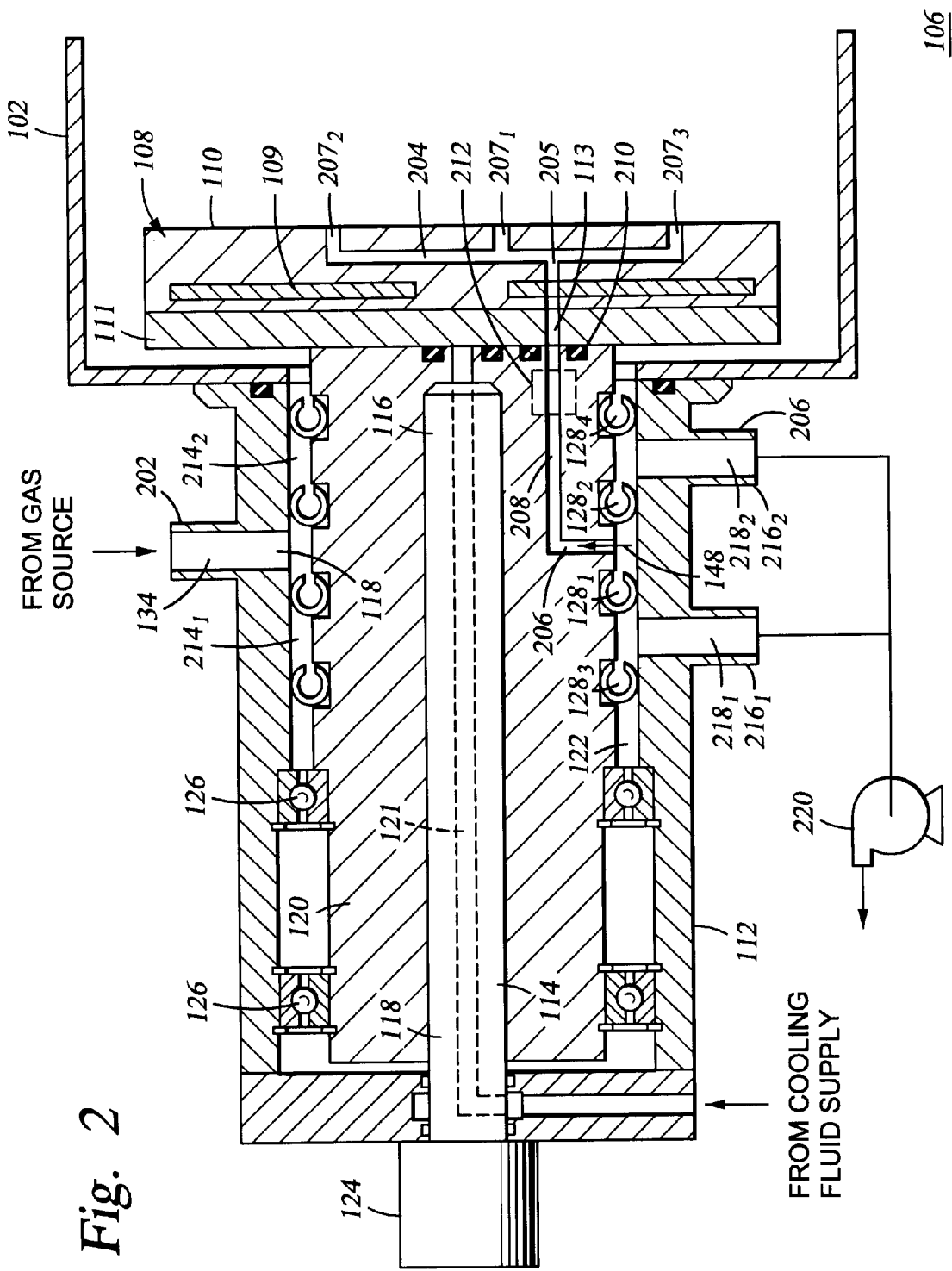
FIG. 2 depicts a cross-sectional view of a first embodiment of a substrate support assembly of the semiconductor wafer processing system of FIG. 1.

FIG. 2 depicts a cross-sectional view of a first embodiment of a substrate support assembly of the semiconductor wafer processing system of FIG. 1. FIG. 2 should be referred to in conjunction with FIGS. 1 and 4. Referring to FIG. 2, the shaft conduit 132 is substantially L-shaped and comprises a lower leg portion 206, and an upper leg portion 208. The lower leg portion 206 is disposed in the shaft 120 and axially aligned with the housing conduit 134. Specifically, the lower leg portion 206 and housing conduit 134 are positioned on opposing sides of the support assembly channel 122.

The upper leg portion 208 of the L-shaped shaft conduit 132 extends through the shaft 120 to a chuck manifold 204 disposed in the electrostatic chuck 108. Generally, the chuck manifold 204 comprises at least one bore 207 extending from the chuck surface 110, through the electrostatic chuck 108, and axially aligned with the upper leg portion 208 of the shaft conduit 132. FIGS. 2 and 4, depict the chuck manifold 204 illustratively comprising more than one bore, that is, three manifold bores $207_1$ through $207_3$ (collectively manifold bores 207). Each manifold bore 207 extends from the chuck surface 110, through the electrostatic chuck 108, and interconnects at a manifold junction 205 within the chuck 108. The manifold junction 205 is axially aligned with the upper leg portion 208 to provide the gas to the various bores 207. The chuck manifold bores 207 are distributed at various locations within the chuck 108 to facilitate adequate distribution of the backside gas over the backside of the wafer 101.

A shaft conduit o-ring 210 circumscribes the upper leg portion 208 and chuck manifold 204 between the chuck 108 and shaft 120 to seal the shaft conduit 132 therebetween from gas leaks. In an embodiment where a cooling plate 111 is disposed beneath the chuck 108, the cooling plate 111 is provided with a cooling plate conduit 113. The cooling plate conduit 113 is a bore extending through the cooling plate 111 and is axially aligned between the chuck manifold 204 and the upper leg portion 208 of the shaft conduit 132. As such, the shaft conduit o-ring 210 is disposed between the cooling plate 111 and shaft 120 in a similar manner as described above.

In addition, a plurality of seals $128_1$ through $128_n$ (collectively seals 128) is disposed in the substrate support channel 122. Specifically, a first seal $128_1$ and a second seal $128_2$ are disposed in the substrate support channel 122 and on opposing sides of the housing conduit 134 and the at least one shaft conduit 132. As such, the first and second seals $128_1$ and $128_2$ form an inner pair of seals $128_{1-2}$, which define a radial passageway 140 between the housing conduit 134 and the at least one shaft conduit 132. The seals 128 are preferably radial lip seals having a spring disposed therein. Alternately, an o-ring or similar sealing device capable of sealing the backside gas within the radial passageway 140 with minimal leakage, as the shaft 120 rotates within the housing 112, may be utilized. Furthermore, the seals 128 have a minimal coefficient of friction (e.g., less than 0.3 and preferably 0.18), thereby reducing wear to the shaft 120 and to the seals 128 themselves. Typically, the seals 128 are fabricated from a material selected from the group comprising TEFLON®, filled TEFLON®, and the like, and preferably from an ultra-high molecular weight polyethylene.

The substrate support assembly 106 further comprises a gas inlet 202, which facilitates coupling the gas conduit 138 to the housing conduit 134. The gas delivery system 105 provides the heat transfer gas having a pressure in the range of 1 to 20 Torr. In this manner, the backside gas is provided from the gas source 130, through the gas conduit 138, the housing conduit 134, the radial passageway 140, the at least one shaft conduit 132, and to the backside of the wafer 101. Specifically, the heat transfer gas travels through the smaller leg portion 206, the larger leg portion 208, and the chuck manifold 204 of the shaft conduit 132, as depicted by the arrow representing the backside gas path 148.

Figure 3:
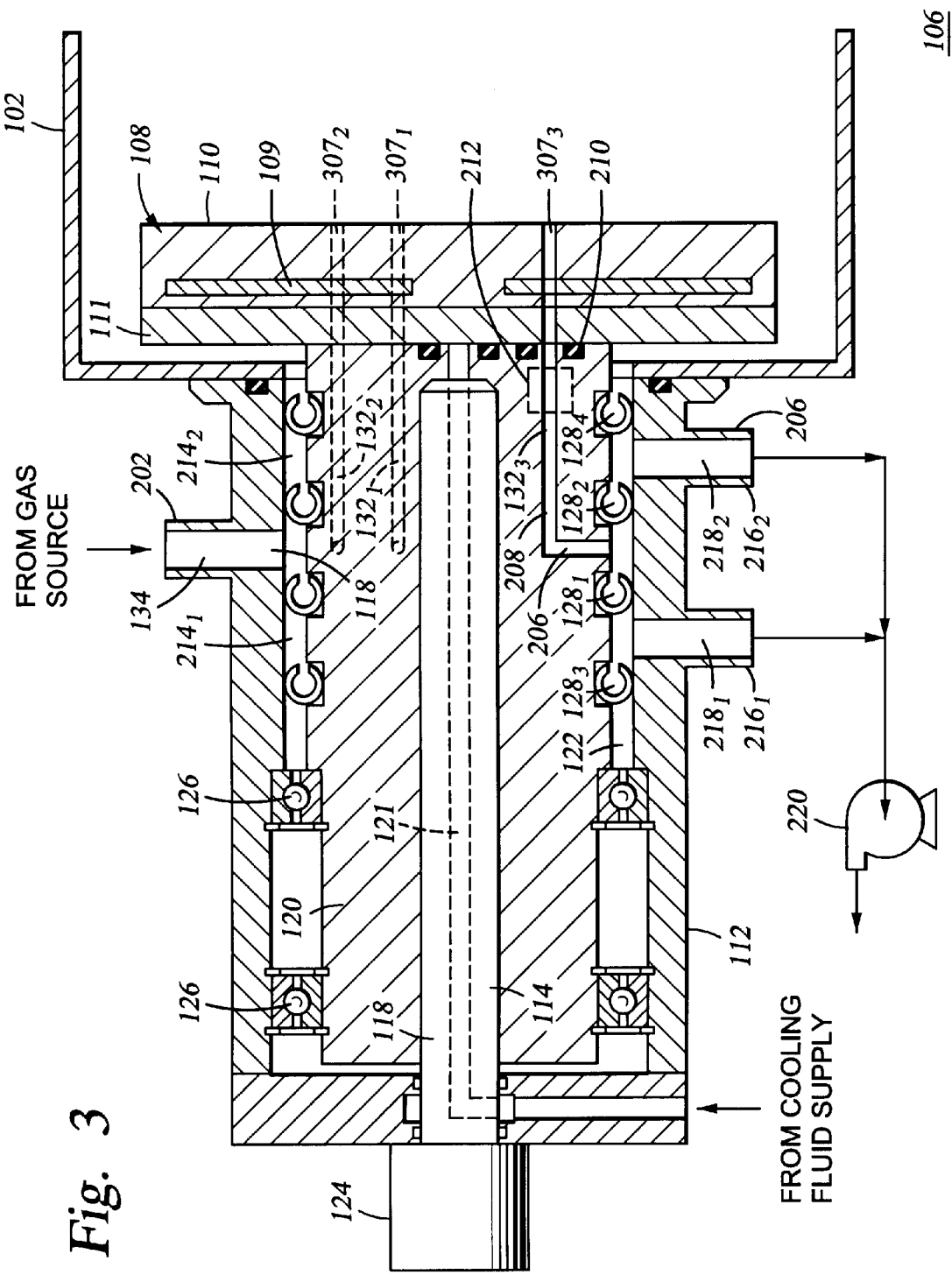
FIG. 3 depicts a cross-sectional view of a second embodiment of a substrate support assembly of the semiconductor wafer processing system of FIG. 1.

As discussed herein, the at least one shaft conduit 132 may be more than one shaft conduit. FIG. 3 depicts a cross-sectional view of a second embodiment of a substrate support assembly of the semiconductor wafer processing system of FIG. 1. FIG. 3 should also be viewed in conjunction with FIG. 4. FIG. 4 depicts a top view of the substrate support assembly of the semiconductor wafer processing system 100 of FIG. 3. Referring to FIG. 3, three shaft conduits $132_1$ through $132_3$ are depicted in the cross sectional view of the chuck support assembly 106. In particular, the three shaft conduits 132 extend through the shaft 120 to three correspondingly axially aligned chuck bores $307_1$ through $307_3$ (collectively chuck bores 407).

Referring to FIG. 4, the chuck support surface 110 comprises a plurality of grooves 404 having an arrangement that most efficiently transfers heat from the backside surface area of the wafer 101. For example, in FIG. 4, the grooves 404 are arranged in concentric circles radiating outward and intersected by radially extending grooves extending from proximately the center 406 to proximately the periphery 408 of the support surface 110. In this example, the three chuck bores $307_1$ through $307_3$ are arranged 120° apart from each other and intersect with a different concentric circle groove. This is the same configuration for the chuck manifold 204 and corresponding bores 207 of the first embodiment depicted in FIG. 1.

The backside gas flows from each shaft conduit $132_{1-3}$ to different areas of the chuck surface 110. Thus, the shaft conduits 132 are disposed radially apart and at different distances from the center 406 of the chuck support surface 110. Specifically, the upper leg portions 208 for the three shaft conduits have the same length. However, the lower leg portions 206 have varying lengths such that the upper leg portion 206 closest to the periphery 408 of the support surface 110 and closest to the housing 112 has the shortest length. In contrast, the upper leg portion 206 closest to the center 406 of the support surface 110 and spindle 114 has the longest length of the three lower leg portions.

Furthermore, one skilled in the art will for which this invention pertains will understand that the grooves 404 and corresponding shaft conduits 132 may be arranged in any other manner that facilitates sufficient transfer of heat from the backside of the wafer 101. For example, a single shaft conduit 132 having a single lower leg portion 206 and a plurality of upper leg portions 208 branching off through the shaft 120 may be utilized. Likewise, a single shaft conduit 132 having an upper leg portion 208 extending through the spindle 114 and coupled to a chuck manifold 204 having a plurality of chuck bores or single chuck bore 207, or any other combination and/or arrangement may be utilized.

In any arrangement as discussed above, when the wafer 101 is "chucked" during wafer processing, a seal is formed between the backside of the wafer 101 and the surface 110 of the electrostatic chuck 108. The backside gas filling the space between the backside of the wafer 101 and the grooves 404 in the support surface 110 ensures good thermal conduction between the wafer 101 and the chuck 108.

For a detailed understanding of the grooves 404 disposed in a support assembly 106, the reader should refer to the drawings and the detailed description in commonly assigned U.S. patent entitled "Electrostatic Chuck Having A Grooved Surface", by Steger, U.S. Pat. No. 5,522,131, filed Jun. 4, 1996, and incorporated herein by reference. That patent teaches a method of fabricating the chuck with grooves arranged in a particular pattern. In addition, one skilled in the art for which this invention pertains will understand that the shaft conduit 132 may also vary in shape. For example, the lower and upper leg portions 206 and 208 may define an obtuse shaft conduit 132 or any other shape capable of delivering the gas to the support surface 110.

Referring to FIG. 1, the gas valve 136 (drawn in phantom) is external to the chamber 102 and controls the flow of gas through the substrate support assembly to the backside of the wafer. Referring to FIG. 2, a second embodiment for the gas valve depicts a gas shutoff valve 212 (drawn in phantom) disposed in the shaft conduit 132. The gas shutoff valve 212 is designed to be placed in close proximity (e.g., within two centimeters) of the electrostatic chuck 108. One can avoid the use of long lengths of gas lines, and thus minimize the volume of the backside gas trapped between the valve 212 and the backside of a wafer 101. Where more than one shaft conduit 132 is utilized, then a corresponding gas shutoff valve 212 is disposed therein and proximate the chuck 108. Therefore, during wafer transfer after processing is complete, only a negligible amount of the backside gas is admitted into the process chamber 102 and adverse impact on the ion beam performance can be avoided. This design is made possible by the compact size of the valve 212, allowing it to be placed in close proximity to the chuck 108. The need for otherwise long lengths of connecting gas lines can thus be eliminated.

For a detailed understanding of the gas shutoff valve disposed in a support assembly 106, the reader should refer to the drawings and the detailed description in commonly assigned U.S. Pat. No. 6,179,921, issued Jan. 30, 2001, entitled "Backside Gas Delivery System For A Semiconductor Wafer Processing System", and incorporated herein by reference. That patent teaches a backside gas delivery system 105 having the gas shutoff valve disposed in the spindle 114.

Referring to FIG. 2, the at least one shaft conduit 132 is depicted as rotated 180° from the position depicted in FIG. 1. As such, the backside gas path 148 circumscribes the shaft 120 through the support assembly channel 122, and through the at least one shaft conduit 132 before exiting between the grooves 404 and wafer backside. Thus, the rotation of the chuck 108 and shaft 120 does not affect the flow of the gas, since the channel 122 is always filled with the gas at a higher pressure than the at least one shaft conduit and vacuum chamber.

FIGS. 1 and 2 further depict two additional seals $128_3$ and $128_4$, which form a second pair or outer pair of seals $128_{3-4}$. Specifically, the outer pair of seals $128_{3-4}$ are disposed in the substrate support channel 122 and circumscribe the shaft 120 radially outward from the inner pair of seals $128_{1-2}$.

A first and second differential pressure zone $214_1$ and $214_2$ (collectively differential pressure zones 214) is defined between each adjacent and inner and outer seal $128_{1-3}$ and $128_{2-4}$ respectively. Specifically, the first and third seals $128_1$ and $128_3$, and the shaft 120 and housing 112 portions therebetween define the first differential pressure zone $214_1$. Likewise the second and fourth seals $128_2$ $128_4$, and the shaft 120 and housing 112 portions therebetween define the second differential pressure zone $214_2$. Extending radially outward from the housing 112 are a pair of evacuation outlets $216_1$ and $216_2$ (collectively evacuation outlets 216) each having an evacuation outlet channel $218_1$ and $218_2$ (collectively evacuation outlet channels 218) respectively.

At least one vacuum pump 220 is positioned external to the processing chamber 102 and is coupled to each of the evacuation outlets 216 via a flexible hose material (not shown) in order to allow for movement of the wafer support assembly 106 in the ion implanter chamber 102. The plurality of seals 128 are not perfect seals, that is, there is always some leakage through the seals 128, while providing the backside gas to the rotating the shaft 120 and chuck 108. The outer pair of seals $128_{3-4}$ is utilized to capture any escaping gases from either side of the inner pair of seals $128_{1-2}$. In particular, the escaped backside gasses are trapped in the differential pressure zones 214. The vacuum pump 220 evacuates the escaped gas out of the differential pressure zones 214 for recapture outside of the chamber 102. In this manner, any escaped backside gas is removed from the chamber 102 and averts the risk of contaminating the wafer 101 during processing. A person skilled in the art will understand that only one seal 128 may be utilized to define a single differential pressure zone 114, however, preferably two or more seals 128 defining two or more differential pressure zones are utilized on either side of the pair of inner seals $128_{1-2}$.

In addition, the at least one vacuum pump 220 may also provide differential pumping in stages to prevent atmospheric gases from escaping into the high vacuum process chamber. In particular, the substrate support assembly 106 is predominantly at atmospheric pressure such as 1 atmosphere of pressure. The housing 112, shaft 120, support assembly channel 122, and the like are at atmospheric pressure. Only the chuck portion 108 of the chuck assembly 106 and the wafer 101 are exposed to the vacuum environment in the chamber 102. Since the backside gas and atmospheric gases are at a higher pressure than the vacuum environment in the chamber, the backside gas and atmospheric gases will flow to the lower pressured environment. As such, the vacuum pump 220 is configured in stages to evacuate the gasses from the differential pressure zones 214 having the highest pressures first.

For example, the first differential pressure zone $214_1$ will have greater pressure than the second differential pressure zone $214_2$, since the first differential pressure zone $214_1$ is further positioned from the vacuum chamber 102, while the second differential pressure zone $214_2$ is adjacent to the vacuum chamber 102. In such a configuration, the vacuum pump 220 will evacuate the bulk of the gas from the first differential pressure zone $214_1$ in a first differential pumping stage. The vacuum pump 220 will then be able to achieve a lower base vacuum as the vacuum pump 220 removes the undesired gases from the second differential pressure zone $214_2$, that is, in a second differential pumping stage. Since the leak rate of backside gas is small compared to the gasses removed, the differential stage pumping is capable of reducing the total gas load escaping into the chamber 102.

Moreover, adding more seals 128 to the support assembly 106 as described above will define additional differential pumping stages. Thus, the differential pumping may be provided for each of the additional differential pumping stages such that the first stage pumped will achieve a reduced pressure environment, and then each subsequent stage will have successively lower pressure environments. In this manner, a differential pressure zone positioned closest to the chamber 102 is evacuated such that differential pumping zone approaches the vacuum environment of the chamber 102.

While the present invention incorporating a backside gas delivery system 105 through a electrostatic chuck 108, which is capable of rotating 360° during processing is well suited for use in an ion implanter, it can also be adapted for use with other wafer processing systems. Furthermore, the backside gas delivery system 105 of the present invention is disposed through the shaft 120 of the substrate support assembly. Such design choice contemplates optionally utilizing the spindle 114 for facilitating fluid cooling lines coupled to a cooling plate, which is disposed between the electrostatic chuck 108 and shaft 120. However, one skilled in the art will recognize that the spindle 114 may also be adapted to facilitate the backside gas delivery system 105 as well. Accordingly, although the embodiments that incorporates the teachings of the present invention has been shown and described in detail herein, those skilled in the art can readily devise many other varied embodiments that still incorporate these teachings.

What is claimed is:

1. A semiconductor substrate support apparatus comprising:
    a support chuck having at least one chuck manifold extending through said support chuck;
    a rotatable shaft coupled to said support chuck, said shaft having at least one shaft conduit disposed therein and coupled to said at least one chuck manifold;
    a housing circumscribing said shaft, said housing having a housing conduit adapted for connection to a gas source; and
    a plurality of seals disposed between said shaft and said housing and defining a radial passageway between said at least one shaft conduit and said housing conduit, wherein said housing conduit, radial passageway, and shaft conduit serially form a channel for providing gases from said gas source to said chuck manifold.

2. The apparatus of claim 1 wherein said housing circumscribing said shaft defines a support assembly channel therebetween.

3. The apparatus of claim 1 wherein said at least one chuck manifold comprises at least one bore extending from a surface of said support chuck.

4. The apparatus of claim 1 wherein said support chuck is an electrostatic chuck.

5. The apparatus of claim 1 wherein said shaft comprises a spindle fixedly extending therethrough and coupled to said support chuck, and adapted for connection to a motor for rotation.

6. The apparatus of claim 1 wherein said housing further comprises a plurality of bearings disposed between said housing and shaft.

7. The apparatus of claim 1 wherein said at least one shaft conduit is three shaft conduits.

8. The apparatus of claim 1 wherein said plurality of seals are lip seals.

9. The apparatus of claim 2 wherein said plurality of seals comprise an inner pair of seals wherein each seal is disposed in said support assembly channel and on opposing sides of said at least one shaft conduit and said housing conduit thereby defining said radial passageway therebetween said inner pair of seals.

10. The apparatus of claim 1 wherein said at least one shaft conduit is coupled to a gas shutoff valve.

11. The apparatus of claim 1 wherein said housing conduit is coupled to a backside gas valve.

12. The apparatus of claim 10 wherein said plurality of seals further comprises at least a third seal, said third seal disposed radially outward from an inner pair of seals.

13. The apparatus of claim 12 wherein at least one inner seal of said pair of inner seals and said at least third seal are disposed in said support assembly channel to define at least one differential pressure zone therebetween.

14. The apparatus of claim 13 wherein said apparatus further comprises at least one differential pumping passage extending from at least one said differential pressure zone, through said housing, and adapted for connection to at least one differential pump.

15. The apparatus of claim 14 wherein said at least one differential pump maintains said differential pressure zone at a first pressure lower than a second pressure external to said differential pressure zone.

16. The apparatus of claim 15 wherein said first pressure in said differential pressure zone is a vacuum.

17. An apparatus for processing a semiconductor wafer comprising:
    a processing chamber;
    a support chuck having at least one chuck manifold extending through said support chuck;
    a rotatable shaft coupled to said support chuck, said shaft having at least one shaft conduit disposed therein and coupled to said at least one chuck manifold;
    a housing circumscribing said shaft, said housing having a housing conduit adapted for connection to a gas source; and
    a plurality of seals disposed between said shaft and said housing and defining a radial passageway between said at least one shaft conduit and said housing conduit, wherein said housing conduit, radial passageway, and shaft conduit serially form a channel for providing gases from said gas source to said chuck manifold.

18. The apparatus of claim 17 wherein said housing circumscribing said shaft defines a support assembly channel therebetween.

19. The apparatus of claim 17 wherein said at least one chuck manifold comprises at least one bore extending from a surface of said support chuck.

20. The apparatus of claim 17 wherein said support chuck is an electrostatic chuck.

21. The apparatus of claim 17 wherein said shaft comprises a spindle fixedly extending therethrough and coupled to said support chuck, and adapted for connection to a motor for rotation.

22. The apparatus of claim 17 wherein said housing further comprises a plurality of bearings disposed between said housing and shaft.

23. The apparatus of claim 17 wherein said at least one shaft conduit is three shaft conduits.

24. The apparatus of claim 17 wherein said plurality of seals are lip seals.

25. The apparatus of claim 18 wherein said plurality of seals comprise an inner pair of seals wherein each seal is disposed in said support assembly channel and on opposing sides of said at least one shaft conduit and said housing conduit thereby defining said radial passageway therebetween said inner pair of seals.

26. The apparatus of claim 17 wherein said at least one shaft conduit is coupled to a gas shutoff valve.

27. The apparatus of claim 17 whereon said housing conduit is coupled to a backside gas valve.

28. The apparatus of claim 25 wherein said plurality of seals further comprises at least a third seal, said third seal disposed radially outward from said inner pair of seals.

29. The apparatus of claim 28 wherein at least one inner seal of said pair of inner seals and said at least third seal are disposed in said support assembly channel to define at least one differential pressure zone therebetween.

30. The apparatus of claim 29 wherein said apparatus further comprises at least one differential pumping passage extending from at least one said differential pressure zone, through said housing, and adapted for connection to at least one differential pump.

31. The apparatus of claim 30 wherein said at least one differential pump maintains said differential pressure zone at a first pressure lower than a second pressure external to said differential pressure zone.

32. The apparatus of claim 31 wherein said first pressure in said differential pressure zone is a vacuum.

* * * * *

UNITED STATES PATENT AND TRADEMARK OFFICE
CERTIFICATE OF CORRECTION

PATENT NO. : 6,689,221 B2  
DATED : February 10, 2004  
INVENTOR(S) : Ryding et al.

Page 1 of 1

It is certified that error appears in the above-identified patent and that said Letters Patent is hereby corrected as shown below:

Column 12,
Line 1, please change "whereon" to -- wherein --.

Signed and Sealed this

Twenty-seventh Day of July, 2004

JON W. DUDAS  
*Acting Director of the United States Patent and Trademark Office*